(12) United States Patent
Aoki et al.

(10) Patent No.: US 7,459,829 B2
(45) Date of Patent: Dec. 2, 2008

(54) SURFACE ACOUSTIC WAVE DEVICE AND METHOD OF MANUFACTURING THE SAME, IC CARD, AND MOBILE ELECTRONIC APPARATUS

(75) Inventors: Shinya Aoki, Minowa (JP); Yoshio Maeda, Fujimi (JP)

(73) Assignee: Seiko Epson Corporation (JP)

( * ) Notice: Subject to any disclaimer, the term of this patent is extended or adjusted under 35 U.S.C. 154(b) by 322 days.

(21) Appl. No.: 11/305,445

(22) Filed: Dec. 16, 2005

(65) Prior Publication Data

US 2006/0131998 A1 Jun. 22, 2006

(30) Foreign Application Priority Data

Dec. 17, 2004 (JP) ............................. 2004-366879
Sep. 30, 2005 (JP) ............................. 2005-288046

(51) Int. Cl.
*H01L 41/04* (2006.01)
*H03H 9/145* (2006.01)

(52) U.S. Cl. ............................. 310/313 B; 310/313 R; 333/189; 333/193; 333/195

(58) Field of Classification Search ......... 333/189–195; 310/313

See application file for complete search history.

(56) References Cited

U.S. PATENT DOCUMENTS

| | | | | | |
|---|---|---|---|---|---|
| 4,362,961 | A | * | 12/1982 | Gerber | ........................ 310/370 |
| 4,734,608 | A | * | 3/1988 | Takoshima | .............. 310/313 R |
| 6,498,422 | B1 | * | 12/2002 | Hori | ........................... 310/344 |
| 2002/0168798 | A1 | * | 11/2002 | Glenn et al. | ................. 438/110 |
| 2004/0104791 | A1 | * | 6/2004 | Satoh et al. | ................... 333/193 |
| 2004/0207485 | A1 | | 10/2004 | Kawachi et al. | |

FOREIGN PATENT DOCUMENTS

| | | |
|---|---|---|
| EP | 0 602 666 | 6/1994 |
| JP | 01-239982 | 9/1989 |
| JP | 07-086867 | 3/1995 |
| JP | 08-130433 | 5/1996 |
| JP | 08-213874 | 8/1996 |
| JP | 2002-016476 | 1/2002 |
| JP | 2003-087072 | 3/2003 |
| JP | 2003-174107 | 6/2003 |
| JP | 2004-304622 | 10/2004 |

OTHER PUBLICATIONS

Communication from European Patent Office regarding corresponding application.

* cited by examiner

*Primary Examiner*—J. A San Martin
(74) *Attorney, Agent, or Firm*—Harness, Dickey & Pierce, P.L.C.

(57) ABSTRACT

A surface acoustic wave device includes a surface acoustic wave (SAW) chip and a cover that are bonded in a body by bonding a metal bonding portion of the SAW chip and a metal bonding portion of the cover and bonding extraction electrodes of the SAW chip and connection electrodes of the cover so as to hermetically seal IDT electrodes disposed on a main surface of a piezoelectric substrate of the SAW chip within a space defined between the SAW chip and the cover. The IDT electrodes and external electrodes on an upper surface of an insulating substrate of the cover are electrically connected to each other through conductive materials formed in through-holes.

16 Claims, 13 Drawing Sheets

(A)

(B)

F I G. 2
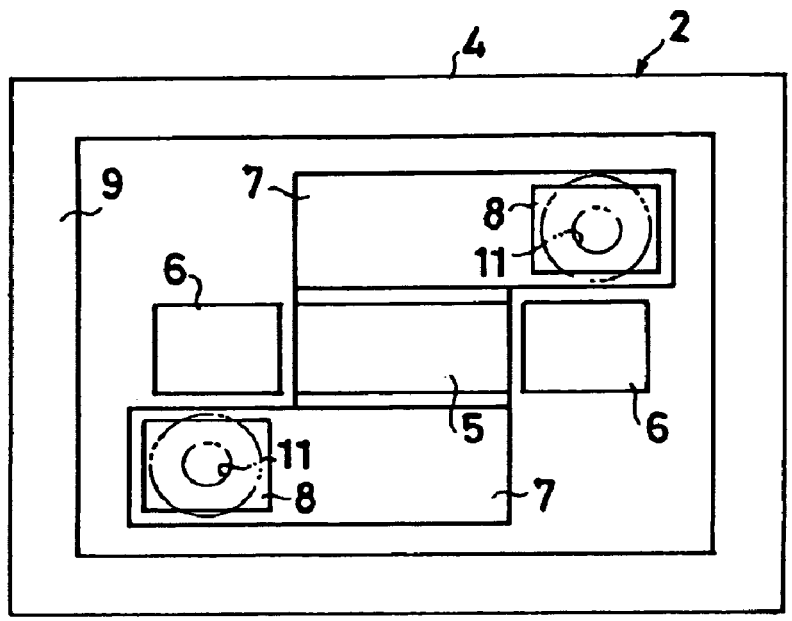
F I G. 3
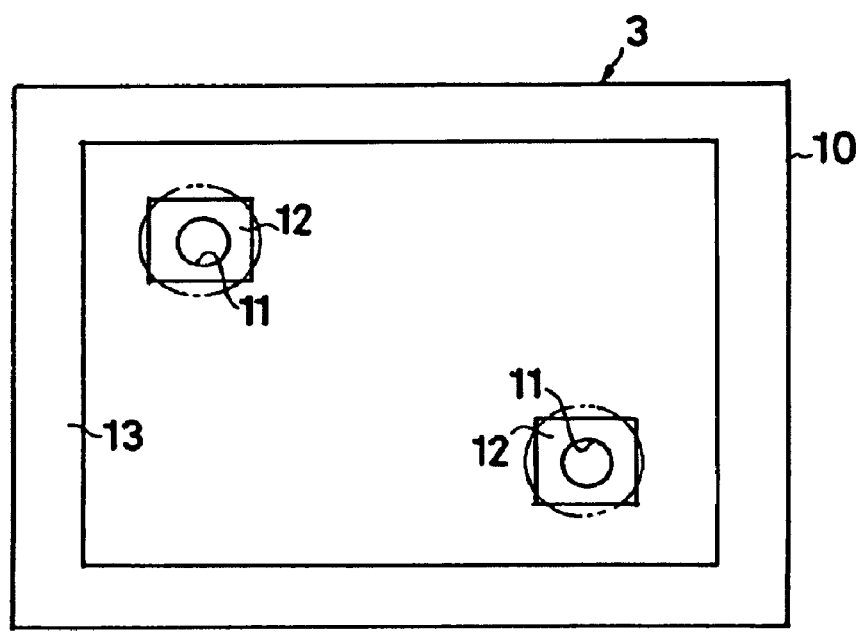

(A)

(B)

(C)

(D)

(A)

(B)

F I G. 6
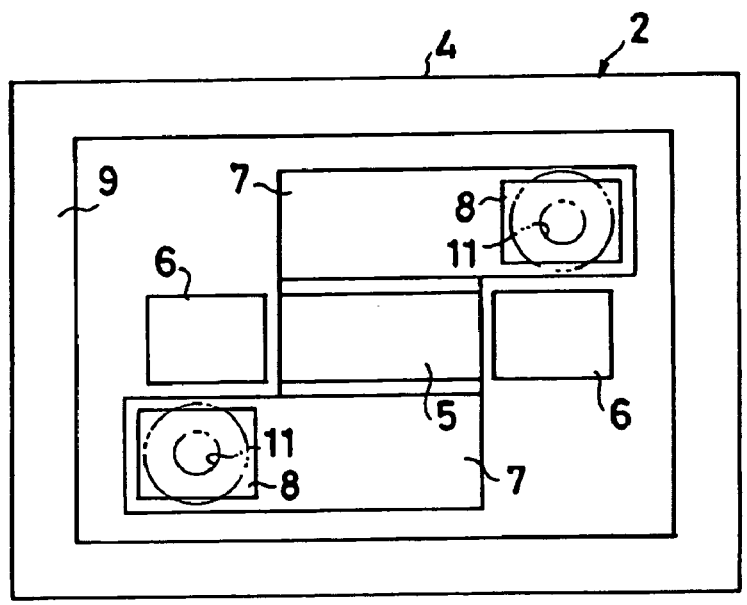
F I G. 7
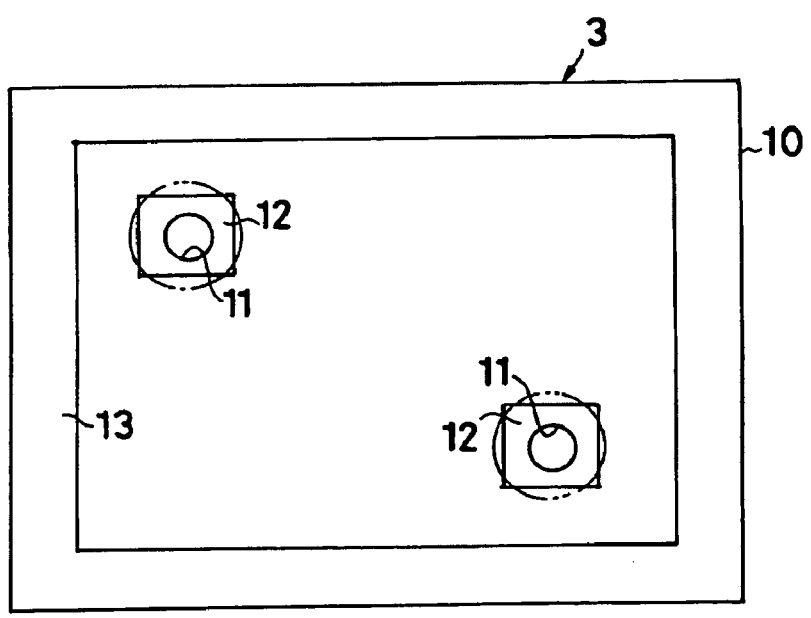

(A)

(B)

F I G. 13
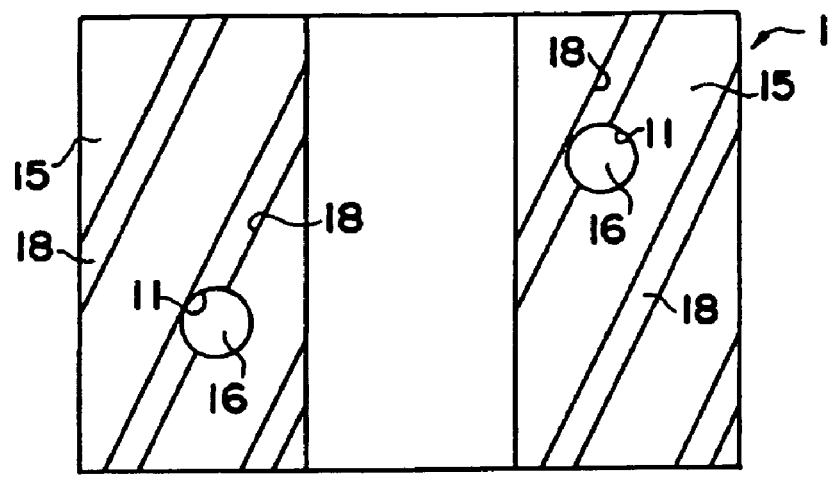
F I G. 14
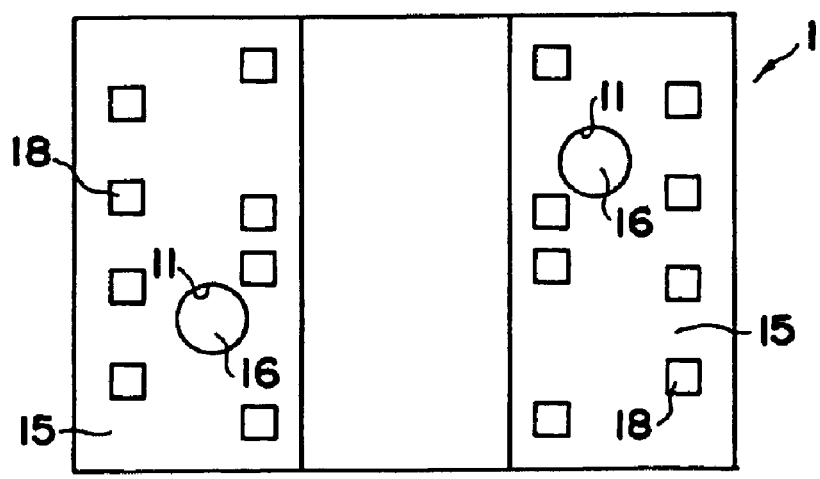

F I G. 15
(A)
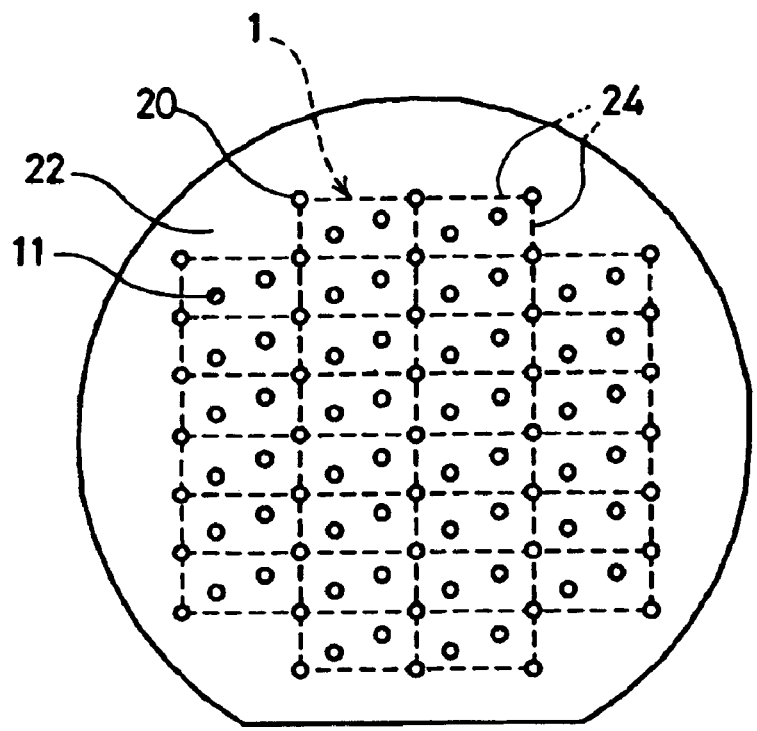
(B)
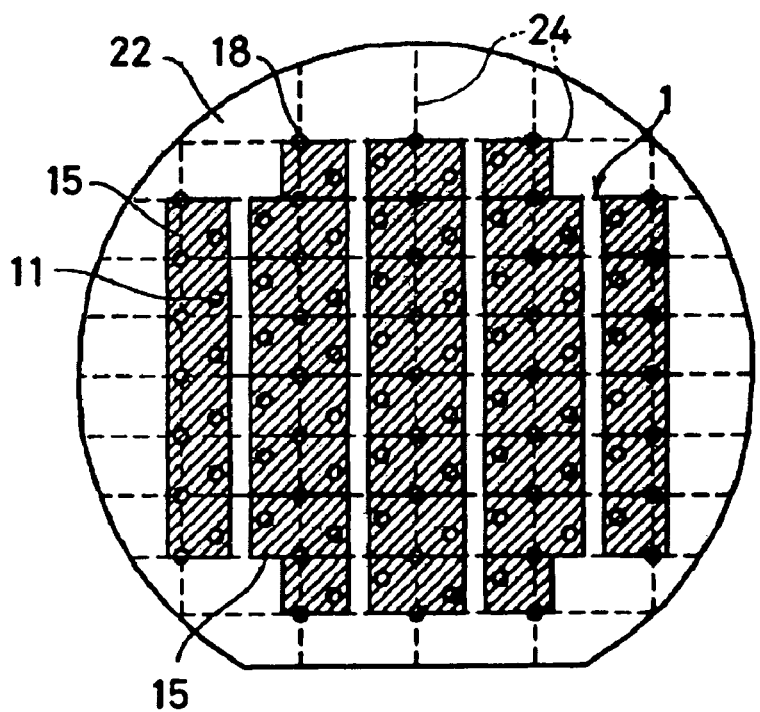

F I G. 17
(A)
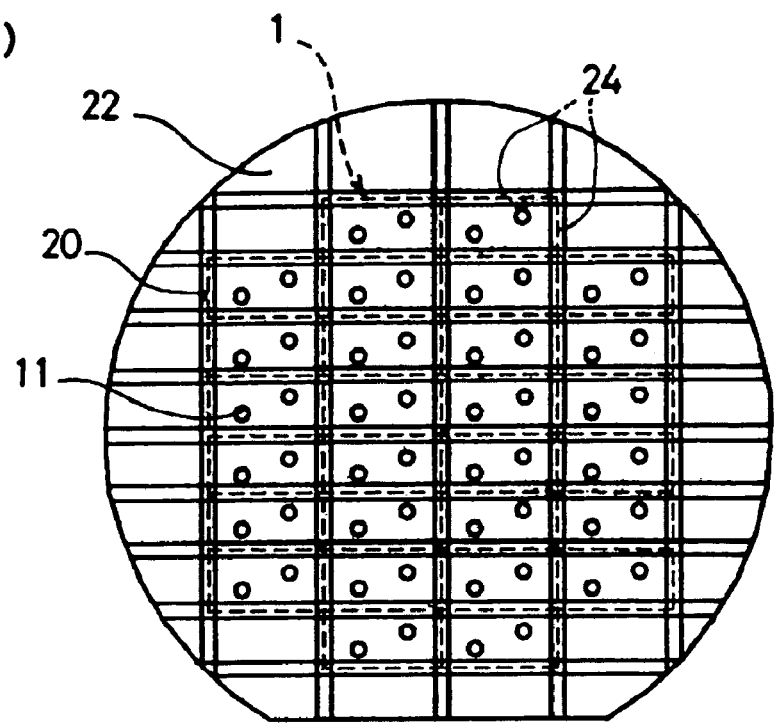
(B)
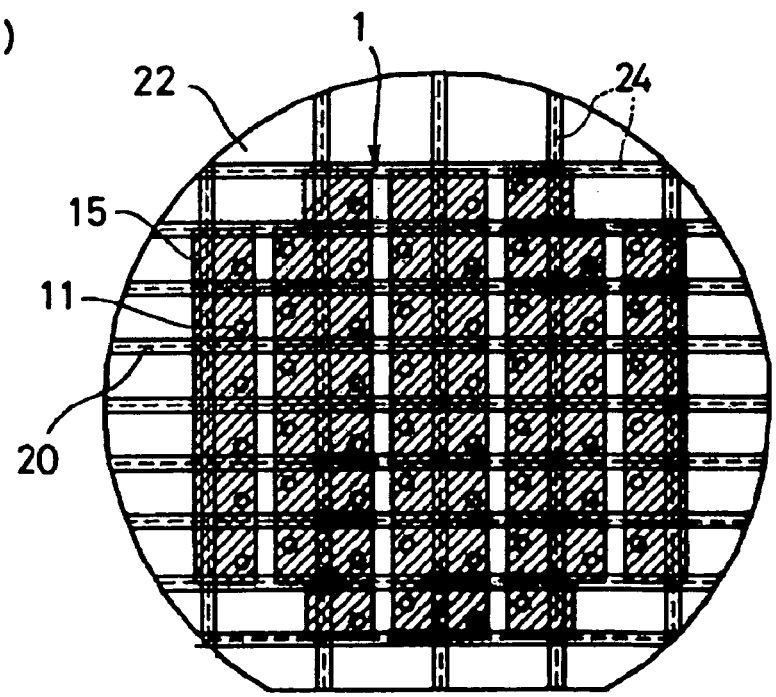

SURFACE ACOUSTIC WAVE DEVICE AND METHOD OF MANUFACTURING THE SAME, IC CARD, AND MOBILE ELECTRONIC APPARATUS

RELATED APPLICATIONS

This application claims priority to Japanese Patent Application Nos. 2004-366879 filed Dec. 17, 2004 and 2005-288046 filed Sep. 30, 2005 which are hereby expressly incorporated by reference herein in their entirety.

BACKGROUND

1. Technical Field

The present invention relates to a surface acoustic wave (SAW) device such as a resonator, a filter, and an oscillator, and to a method of manufacturing the same. In addition, the present invention relates to an IC card and a mobile electronic apparatus having the SAW device.

2. Related Art

In the related art, SAW devices having SAW elements including IDTs (comb-shaped transducers: Inter Digital Transducers) constructed with alternate finger electrodes formed on a surface of a piezoelectric substrate and reflectors and using surface acoustic waves excited from the IDTs have been widely used for various electronic apparatuses. In particular, in addition to high frequency performance and high precision coping with high speed information communication, thinner SAW devices have been required in for small-sized, thin information apparatuses such as IC cards.

In general, a SAW device in the related art is constructed by hermetically sealing SAW elements in a package which is formed by bonding a metal lid to a base made of a ceramic material with seam-welding. In the SAW element, bonding pads of an IDT formed on a surface of a piezoelectric substrate are electrically connected to connection terminals of the package by using bonding wires (for example, see JP-A-2002-16476 and JP-A-2003-87072). In such a structure, the number of parts is quite large, and the construction is too complicated. In addition, in order to provide the bonding wires, a large space is needed in the package, so that there is a limitation on implementing a small-sized thin SAW device.

Therefore, there has been proposed an electronic part constructed by accommodating the SAW device in a space formed between upper and lower cases, electrically bonding input/output electrodes of the SAW device to second connection members of an outer surface of the case with first connection members disposed in through-holes of the upper case, and sealing the through-holes with the first or second connection members (for example, see JP-A-7-86867). As a result, by simplifying the sealing structure of the through-holes, a simple construction and a small size can be obtained.

In addition, there has been proposed a double-layered surface acoustic wave apparatus including a surface acoustic wave element having IDT electrodes, extraction electrodes, and positive electrode bonding portions on a substrate and a cover plate constructed with a glass plate having through-holes provided with external electrodes, wherein the extraction electrodes and the external electrodes are electrically connected, and wherein the cover plate and the positive bonding portion are bonded to seal the IDT electrodes (for example, see JP-A-8-213874). According to this construction, since the base and the bonding wires mounted on the SAW element are omitted, the entire construction can be simplified, and a small-sized thin product can be obtained. In addition, production cost can be reduced, and frequency characteristics can be stabilized.

On the other hand, in order to improve a high frequency performance of the SAW device, spaces between the alternate finger electrodes must be shortened. In addition, if extrinsic material such as electrode material debris generated during manufacturing processes remains in the space between alternate finger electrodes, a short-circuit may occur. In order to solve this problem, there has been proposed a SAW apparatus capable of preventing short-circuiting between the electrodes without a decrease in Q value by forming a protective film constructed with an oxide film (alumina) with a positive electrode oxidation processes on a surface of an IDT (for example, see JP-A-8-130433).

In the double-layered SAW apparatus disclosed in JP-A-8-213874, the SAW element and the cover plate are bonded by aligning and closely adhering the extraction electrodes and the through-holes at the positive electrode bonding portion, and thereafter, the external electrodes are formed at the through-holes and peripheral portions thereof and are electrically connected to the excitation source by using a sputtering process in a vacuum. In general, since the extraction electrodes are made of aluminum, the surface thereof is naturally oxidized due to air contact. Therefore, after the positive electrode bonding between the SAW element and the cover plate, although the external electrodes are formed in a vacuum, sufficient electrical conduction to the extraction electrodes cannot be ensured.

In addition, the sealing of the through-holes is performed by forming the extraction electrodes and the electrode of the positive electrode bonding portion with the same film thickness so as not to generate gaps between the extraction electrodes and the through-holes and forming the external extrudes on inner sides of the through-holes. However, in practice, it is difficult to surely hermetically seal the gaps between the inner side openings of the through-holes and the extraction electrodes with the electrode films by using the sputtering process.

In addition, since the double-layered SAW device is a surface mounting type, the external electrodes formed on a surface of the cover plate are directly adhered on a surface of a print board or the like with a solder, an adhesive, or the like. However, as the size of the device is smaller and smaller, the mounting area is reduced. Therefore, it may be difficult to mount the SAW device in a good state and obtain sufficient adhesive strength after the mounting thereof, so that sufficient mechanical strength against an external force such as bending cannot be secured.

SUMMARY

In view of the foregoing, it is an advantage of the invention to provide a double-layered SAW device capable of directly bonding a SAW chip and a cover to seal IDT electrodes or the like formed on a surface of the SAW chip and electrically connecting the IDT electrodes and external electrodes on a surface of the cover through through-holes formed in the cover, thereby obtaining a thin product, securing electrical conduction between the IDT electrodes and the external electrodes, and securely hermetically sealing the through-holes.

It is another advantage of the invention to provide a double-layered SAW device capable of preventing short-circuiting of IDT electrodes to improve reliability, securing resonance characteristics, and obtaining a thin product.

It is still another advantage of the invention to provide a double-layered SAW device capable of obtaining a good mounting state even in a small-sized thin product and securing sufficient mechanical strength against bending after the mounting thereof.

It is still another advantage of the invention to provide a method of manufacturing a double-layered SAW device, and particularly, a method of double-layered SAW device capable of improving mass productivity.

According to an aspect of the invention, there is provided a surface acoustic wave device comprising: a SAW chip having IDT electrodes disposed on a main surface of a piezoelectric substrate, extraction electrodes extracted from the IDT electrodes, and a metal bonding portion disposed along the entire periphery of the main surface of the piezoelectric substrate; and a cover having through-holes disposed on an insulating substrate at positions corresponding to the extraction electrodes of the SAW chip, a metal bonding portion disposed along the entire periphery of a lower surface of the insulating substrate, connection electrodes disposed on the lower surface of the insulating substrate along circumferences of openings of the through-holes, and external electrodes disposed on an upper surface of the insulating substrate in peripheries of openings of the through-holes; wherein the SAW chip and the cover are bonded in a body by bonding the metal bonding portion of the SAW chip and the metal bonding portion of the cover and bonding the extraction electrodes of the SAW chip and the connection electrodes of the cover so as to hermetically seal the IDT electrodes within a space defined between the SAW chip and the cover, and wherein the IDT electrodes and the external electrodes are electrically connected to each other through conductive materials formed in the through-holes.

In the double-layered SAW device, by bonding the connection electrodes disposed in the peripheries of the openings of the through-holes for electrode extraction disposed in the cover and the extraction electrodes of the SAW chip as well as by bonding the metal bonding portions disposed in peripheries of the SAW chip and the cover, it is possible to secure electrical conduction between the IDT electrodes and the external electrodes and to more securely hermetically seal the interior of the SAW device. As a result, it is possible to implement a small-sized thin SAW device and to improve stability of operations and frequency characteristics.

In the above aspect of the invention, the thickness of the metal bonding portion of the SAW chip. and the metal bonding portion of the cover in the bonded state and the thickness of the extraction electrodes of the SAW device and the connection electrodes of the cover in the bonded state may be determined to be larger than the thickness of the IDT electrodes. Therefore, the space between the SAW chip and the cover can be larger than the thickness of the IDT electrodes, and the gap between the IDT electrode and the cover can be secured. As a result, since the IDT electrodes are sealed in the SAW device so as not to contact the cover, it is possible to secure predetermined operations.

In addition, in the above aspect of the invention, the space between the SAW chip and the cover in the bonded state may be equal to the thickness of the IDT electrodes. Therefore, since the gap between the upper ends of the IDT electrodes and the lower surface of the cover can be removed by contacting the upper ends of the IDT electrodes and the lower surface of the cover, the thickness of the SAW device can be reduced down to a minimum thickness.

In addition, since the spaces between the alternate finger electrodes constituting the IDT are closed by the lower surface of the cover, extrinsic material such as metal debris cannot penetrate into the spaces, so that it is possible to prevent short-circuiting between the alternate finger electrodes. As a result, it is possible to improve stability and reliability of operations and frequency, and it is possible to improve high frequency performance of the SAW device by further reducing the spaces between the alternate finger electrodes.

In addition, in the above aspect of the invention, the cover may further comprise concave portions disposed at positions at least partially overlapping with the external electrodes on the upper surface of the cover. Therefore, since conductive adhesive such as a solder paste used to mount the SAW resonator on a print board or the like can penetrate into the concave portions, the adhesion area can increase. AS a result, although the SAW device is manufactured with a small size and a thin thickness, it is possible to secure a sufficient mechanical strength after the mounting thereof.

In addition, in the above aspect of the invention, the concave portions may be disposed at outer peripheral edges of the cover. As a result, the SAW device can be supported by the side surfaces at the time of the mounting thereof, so that it is possible to further improve the bonded state and the mechanical strength.

In addition, the concave portions may be coated with metal films. Therefore, since wettability to the concave portions can be improved, a conductive adhesive such as a solder paste can easily penetrate into the concave portions, and surface areas of the external electrodes can increase practically. As a result, it is possible to improve the electrical connection to the print board on which the SAW device is mounted.

In addition, in the above aspect of the invention, inner circumferential surfaces of the through-holes of the cover may be coated with metal films made of the conductive materials. As a result, the IDT electrodes and the external electrodes can be electrically connected to each other.

In addition, in the above aspect of the invention, the metal bonding portion and the extraction electrodes of the SAW chip may be constructed with a Cr/Au film, and the metal bonding portion and the connection electrodes of the cover may be constructed with a Cr/Au film. As a result, theses components can be bonded with a thermal bonding process. In addition, in the above aspect of the invention, the metal bonding portion and the connection electrodes of the cover may have an AuSn alloy film disposed on the Cr/Au film. As a result, the SAW chip and the cover can be bonded with a thermal pressing process or a eutectic bonding process. In any case, since the surface of the Cr/Au film of the extraction electrodes is not oxidized due to air contact (unlike an Al film), it is possible to secure electrical conduction to the connection electrode.

According to another aspect of the invention, there is provided a method of manufacturing a surface acoustic wave device comprising the steps of: forming a SAW chip having IDT electrodes disposed on a main surface of a piezoelectric substrate, extraction electrodes extracted from the IDT electrodes, and a metal bonding portion disposed along the entire periphery of the main surface of the piezoelectric substrate; forming a cover having through-holes disposed on an insulating substrate at positions corresponding to the extraction electrodes of the SAW chip, a metal bonding portion disposed along the entire periphery of a lower surface of the insulating substrate, and connection electrodes disposed on the lower surface of the insulating substrate along circumferences of openings of the through-holes; bonding the SAW chip and the cover in a body by bonding the metal bonding portion of the SAW chip and the metal bonding portion of the cover and bonding the extraction electrodes of the SAW chip and the connection electrodes of the cover so as to hermetically seal the IDT electrodes within a space defined between the SAW chip and the cover; forming external electrodes in peripheries of openings of the through-holes on an upper surface of the cover; and forming conductive materials in the through-holes and electrically connecting the IDT electrodes and the external electrodes.

By doing so, it is possible to implement a small-sized thin product, to secure electrical conduction between the IDT electrodes and the external electrodes, and to hermetically seal the interior of the SAW device. As a result, it is possible to manufacture a double-layered SAW device capable of improving the stability of operations and frequency characteristics.

In the above aspect of the invention, the method may further comprise a step of forming concave portions at positions at least partially overlapping with the external electrodes on the upper surface of the cover. It is preferable that the concave portions on the upper surface of the cover are formed by using the same process as the process for forming the through-holes of the cover. As a result, by using the manufacturing process in the related art, it is possible to manufacture a SAW device having a good bonded state and high mechanical strength after the mounting thereof without increasing the number of processes.

In the above aspect of the invention, the IDT electrodes and the external electrodes may be electrically connected to each other by forming metal films made of the conductive materials on inner circumferential surfaces of the through-holes. Since the inner surfaces of the through-holes are constructed with metal films to improve the wettability thereto, conductive materials can be easily filled therein. As a result, it is possible to improve the reliability of the electrical conduction between the IDT electrodes and the external electrodes and the hermetic sealing of the through-holes.

In the above aspect of the invention, the method may further comprise, after the SAW chip and the cover are bonded in a body, a step of polishing a surface of the -SAW chip and/or the cover. As a result, even in a case where it is difficult to form a thin SAW chip or cover in advance, it is possible to yield a thin SAW device.

In the above aspect of the invention, the metal bonding portion and the extraction electrodes of the SAW chip may be formed with a Cr/Au film, the metal bonding portion and the connection electrodes of the cover may be formed with a Cr/Au film, and the metal bonding portion and the extraction electrodes of the SAW chip and the metal bonding portion and the connection electrodes of the cover may be bonded with a thermal pressing process.

In the above aspect of the invention, the metal bonding portion and the extraction electrodes of the SAW chip may be formed with a Cr/Au film, the metal bonding portion and the connection electrodes of the cover may be formed with a Cr/Au film and an AuSn alloy film thereon, and the metal bonding portion and the extraction electrodes of the SAW chip and the metal bonding portion and the connection electrodes of the cover may be bonded with a thermal pressing process or a eutectic bonding process. In any case, the surface of the Cr/Au film is not naturally oxidized due to air contact unlike an Al film, and the Al film is formed later than the Cr/Au film. As a result, although the surface thereof is oxidized due to air contact, the electrical conduction between the extraction electrodes and the connection electrode does not deteriorate.

In the above aspect of the invention, the method may further comprise the steps of: forming a SAW chip wafer on which a plurality of the SAW chips are continuously disposed in the step of forming the SAW chip; forming a cover wafer on which a plurality of the covers are continuously disposed in the step of forming the cover; bonding the SAW chip wafer and the cover wafer in a body to form a wafer stacked structure by bonding the metal bonding portions of the SAW chips of the SAW chip wafer and the metal bonding portions of the covers of the cover wafer and bond the extraction electrodes of the SAW chips and the connection electrodes of the covers in the step of bonding the SAW chip and the cover in a body; and dicing the wafer stacked structure into individual SAW devices. As a result, since a plurality of the SAW devices can be simultaneously manufactured, it is possible to improve mass productivity.

According to still another aspect of the invention, there is provided an IC card with the aforementioned surface acoustic wave device built therein. As a result, it is possible to implement a desired thin IC card.

According to still further another aspect of the invention, there is provided a mobile electronic apparatus with the aforementioned surface acoustic wave device built therein. As a result, it is possible to implement a much thinner mobile electronic apparatus.

BRIEF DESCRIPTION OF THE DRAWINGS

The invention will be described with reference to the accompanying drawings, wherein like numbers reference like elements.

FIG. 2 is a plan view showing a SAW chip of FIGS. 1A and 1B.

FIG. 3 is a bottom view showing a bonding surface of a cover of FIGS. 1A and 1B.

FIG. 6 is a plan view showing a SAW chip of FIGS. 5A and 5B.

FIG. 7 is a bottom view showing a bonding surface of a cover of FIGS. 5A and 5B.

FIG. 13 is a plan view of a SAW resonator in which concave portions having another pattern different from that of FIGS. 10A and 10B are disposed.

FIG. 14 is a plan view of a SAW resonator in which concave portions having still another pattern different from that of FIGS. 10A and 10B are disposed.

FIG. 15A is a plan view showing a state where concave portions are formed on a glass wafer in a process for manufacturing the SAW resonator of FIGS. 10A and 10B, and FIG. 15B is a plan view showing a state where an electrode film for external electrodes is further formed.

FIGS. 17A and 17B are plan views of a glass wafer used for manufacturing the SAW resonator of FIG. 12.

DESCRIPTION OF EXEMPLARY EMBODIMENTS

Figure 1:
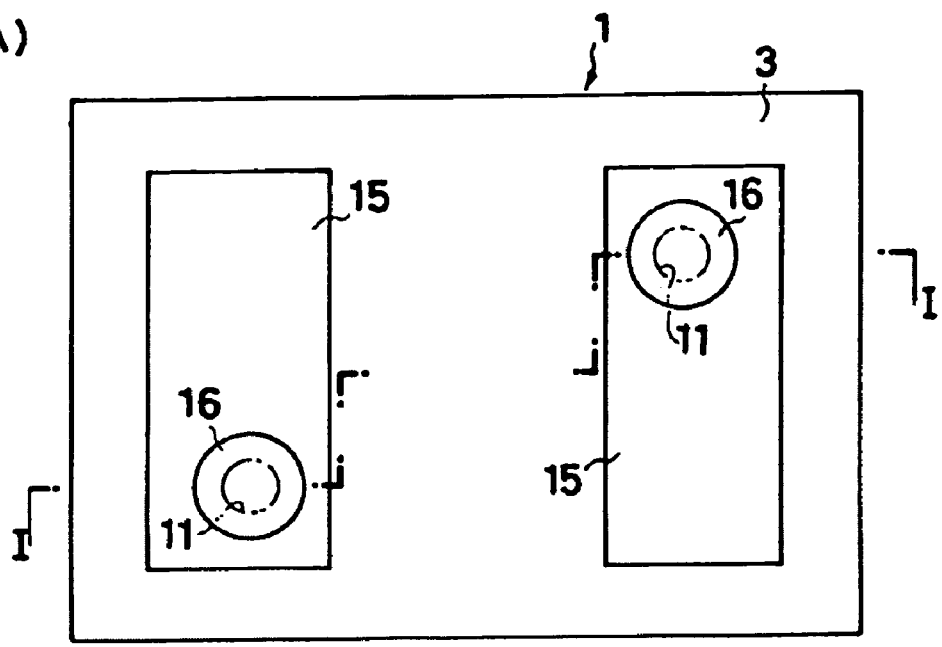
FIG. 1A is a plan view showing a SAW resonator according to a first embodiment of the invention.
FIG. 1B is a cross sectional view taken along line I-I of FIG. 1A.
Figure 1:
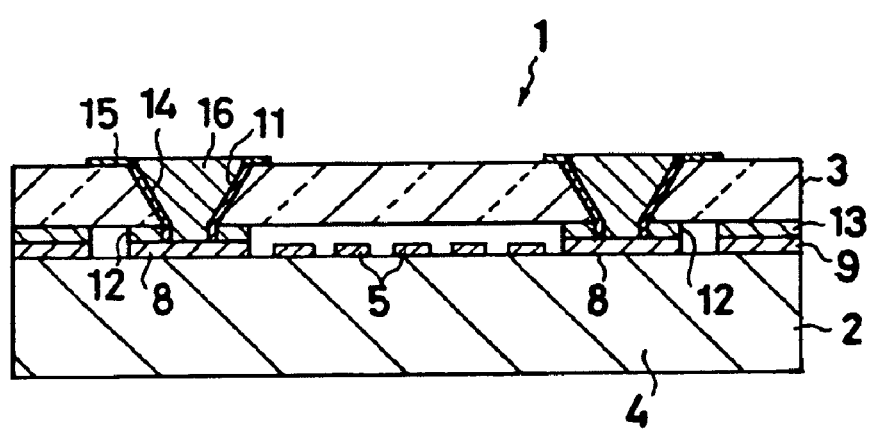

Hereinafter, preferred embodiments of the present invention will be described in detail with reference to the accompanying drawings. In the accompanying drawings, like reference numerals denote like elements.

FIGS. 1A and 1B show a SAW resonator according to a first embodiment of the invention. The SAW resonator 1 has a structure wherein a SAW chip 2 and a cover 3 are directly bonded. As shown in FIGS. 1B and 2, the SAW chip 2 is constructed with a rectangular piezoelectric substrate 4, an IDT 5 constructed with a pair of alternate finger electrodes is formed on a central region of an upper surface thereof, and reflectors 6 and 6 are formed at both longitudinal sides of the IDT. Lead wires 7 and 7 are extracted from bus bars of the alternate finger electrodes in the -opposite directions along longitudinal edges of the piezoelectric substrate 4, and the alternate finger electrodes are connected to extraction electrodes 8 and 8 which are formed approximately at (in the vicinities of) diagonal corner portions of the piezoelectric substrate. A metal. bonding portion 9 is formed along the entire circumference of a peripheral portion of the piezoelectric substrate 4.

Although the piezoelectric substrate 4 is made of quartz in the embodiment, other piezoelectric materials such as lithium, tantalate, and lithium niobate may be used. Although the alternate finger electrodes, the reflectors, and lead wires are constructed with an Al film in terms of characteristics, workability, and cost, other conductive metal materials such as an aluminum alloy which are generally used may be used. The extraction electrodes 8 and 8 and the metal bonding portion 9 are constructed with a Cr/Au film or a Cr/Ni/Au film at the same height.

The cover 3 is constructed with a rectangular glass substrate 10, and tapered through-holes 11 and 11 converging from an upper surface to a lower surface thereof are formed. The through-holes 11 and 11 are disposed in the diagonal direction to correspond to the extraction electrodes 8 and 8 of the SAW chip 2, so that it is possible to reduce an outer dimension and to easily secure a pitch dimension of the through-holes. As shown in FIG. 3, on the lower surface of the glass substrate 10, connection electrodes 12 and 12 having a shape corresponding to the extraction electrodes 8 and 8 of the SAW chip 2 are formed over the entire circumferences of the opening peripheries of the though-holes. In addition, a metal bonding portion 13 is formed on the lower surface of the glass substrate 10 along the entire circumference of a peripheral portion thereof. The through-holes 11 and 11 and inner circumferential surfaces of the connection electrodes 12 and 12 which are continuous with the through-holes are coated with metal films 14 and 14 made of a conductive material. On the upper surface of the glass substrate 10, external electrodes 15 and 15 are formed in the opening peripheries of the through-holes. The external electrodes 15 and 15 are electrically connected to the corresponding connection electrodes 12 and 12 through the metal films 14 and 14 of the through-holes adjacent to the external electrodes.

In the embodiment, the glass substrate 10 is made of soda glass having a thermal expansion coefficient which is close to that of the quartz of the piezoelectric substrate 4. The connection electrodes 12 and 12 and the metal bonding portion 13 are constructed with a Cr/Au film or a Cr/Ni/Au film at substantially the same height. Similarly, the metal films 14 and 14 and the external electrodes 15 and 15 are constructed with a Cr/Au film or a Cr/Ni/Au film.

In an alternative embodiment, the cover 3 may be made of other glass materials or insulating materials having a thermal expansion coefficient which is equal to or approximate to that of quartz or the quartz which is the same as that of the piezoelectric substrate 4. In addition, in a case where the piezoelectric substrate 4 is made of a piezoelectric material other than quartz, the cover 3 may be constructed with a thin plate made of an insulating material having a thermal expansion coefficient which is equal to or approximate to that of the piezoelectric material.

The SAW chip 2 and the cover 3 are bonded in a body by thermally pressing the metal bonding portion 9 and the metal bonding portion 13 and thermally pressing the extraction electrodes 8 and 8 and the connection electrodes 12 and 12, and the IDT 5 and the reflectors 6 and 6 are hermetically sealed within a space defined between the SAW chip 2 and the cover 3. In the embodiment, the thicknesses of the extraction electrodes, the connection electrodes, and metal bonding portions 9 and 13 are determined so that a thickness in the bonded states thereof are larger than a thickness of the Al film. As a result, gaps are defined between the upper ends of the IDT and the reflectors and the lower surface of the cover 3, so that the IDT and the reflectors do not contact the cover 3. Accordingly, it is possible to ensure predetermined excitation and reception operations of the SAW.

The alternate finger electrodes of the IDT 5 are electrically connected to the corresponding external electrodes 15 and 15 through the extraction electrodes 8 and 8 and the connection electrodes 12 and 12 bonded thereto. The through-holes 11 and 11 are filled with sealing members 16 made of a conductive material, so that it is possible to surely improve the reliability of the electrical conduction between the extraction and connection electrodes and the external electrodes and the hermetic sealing of the through-holes. As the conductive material of the sealing members 16, for example, AuSn, AuGe, a solder material, or a high temperature solder may be used.

In an alternative embodiment, the SAW chip 2 and the cover 3 can be bonded in a similar manner by forming an AuSn alloy film on the Cr/Au film of the connection electrodes 12 and 12 and the metal bonding portion 13 and performing a thermal pressing process or a eutectic bonding process.

Now, processes for manufacturing the SAW resonator of FIGS. 1A and 1B in a method according to the invention will be described with reference to FIGS. 4A to 4D. First, a large-sized SAW chip quartz wafer 21 in which a plurality of the SAW chips 2 of FIG. 2 are continuously disposed in transverse and longitudinal directions is prepared. In the quartz wafer 21, a Cr/Au film having a predetermined thickness is formed on a surface of a quartz wafer plate piece, and the extraction electrodes 8 and the metal bonding portions 9 of each SAW chip are formed in desired patterns by using a photolithography technique. Next, an Al film having a predetermined thickness is formed on the surface of the quartz wafer plate piece, and the IDT 5, the reflectors 6, and the lead wires 7 of each SAW chip are formed in desired patterns and so as to electrically connect the lead wires to the extraction electrodes 8 by using a photolithography technique, similarly.

In addition, the IDT, the reflectors and the lead wires may be formed in desired pattern films by depositing aluminum. In the embodiment, since the Al film is formed later on, although an oxide film is formed on a surface thereof due to air contact, the electrical conduction to the extraction electrodes 8 constructed with the Cr/Au film in advance does not deteriorate.

In addition, a large-size cover glass wafer 22 in which a plurality of the covers 3 of FIG. 3 are continuously disposed in transverse and longitudinal directions is prepared. In the glass wafer 22, the though-holes 11 of each cover are formed on each glass plate piece by performing, for example, a sand blasting process or an etching process. In particular, by using the sand blasting process, it is possible to easily form the through-holes in a desired tapered shape. Next, a Cr/Au film having a predetermined thickness is formed on a lower surface of the glass plate piece, that is, a bonding surface for the SAW chip, and the connection electrodes 12 and the metal bonding portions 13 of each cover are formed in desired patterns by using a photolithography technique.

Figure 4:
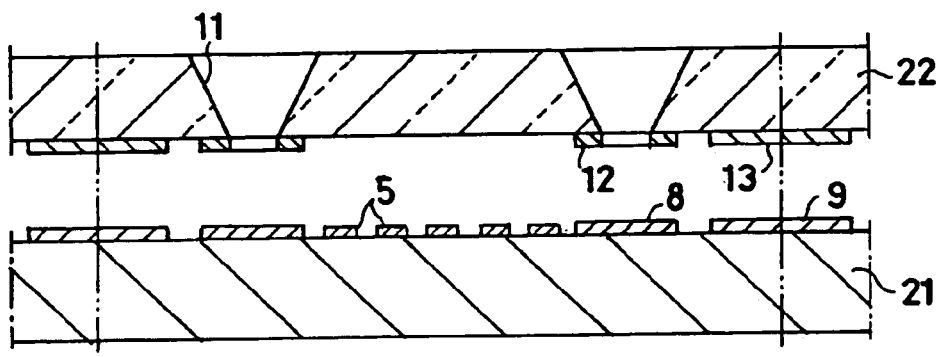
FIGS. 4A to 4D are partially enlarged cross sectional views of a quartz wafer and a glass wafer for explaining a sequence of processes of a method of manufacturing the SAW of FIG. 1.
Figure 4:
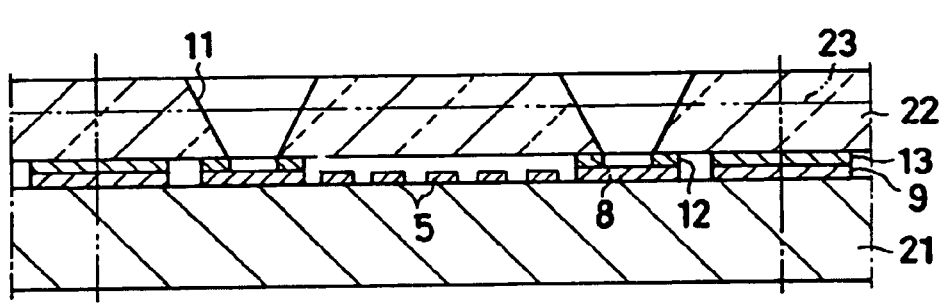
Figure 4:
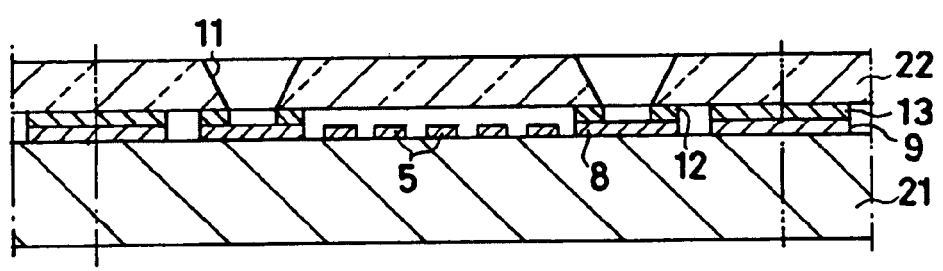
Figure 4:
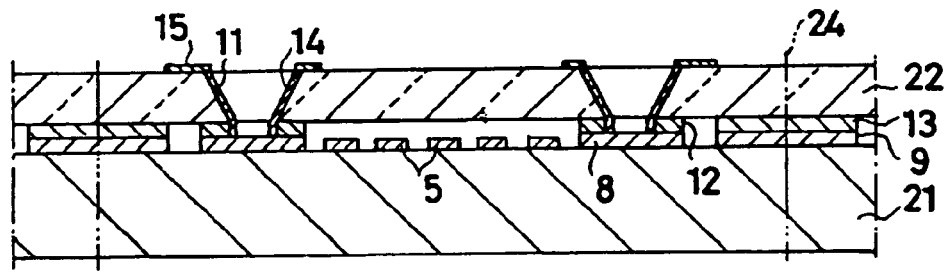

As shown in FIG. 4A, the quartz wafer 21 and the glass wafer 22 are aligned in up/down directions. As shown in FIG. 4B, the metal bonding portions 9 and the metal bonding portions 13 are contacted to overlap with each other, and the extraction electrodes 8 and the connection electrodes 12 are contacted to overlap with each other. In this state, the wafers 21 and 22 are pressed and heated with a thermal pressing process using a commercially available bonding apparatus to be bonded in a body. As a result, the IDT 5 and the reflectors 6 are hermetically sealed within a space between the SAW chip 2 and the cover 3. In an alternative embodiment, in a process for forming the glass wafer 22, an AuSn alloy film is formed on the Cr/Au film of the connection electrodes 12 and the metal bonding portions 13, and similarly, in the aligned and overlapped state thereof, the wafers may be bonded in a body by performing a thermal pressing process or a eutectic bonding process.

Next, in the embodiment, an upper surface of the wafer stacked structure which is formed in the above bonding process, that is, a surface of the cover 3 is uniformly polished down to a height denoted by virtual line 23 in FIG. 4B (see FIG. 4C). The polishing process may be performed by using well-known methods such as grinding and lapping. In the wafer stacked structure, since the bonding between the extraction electrodes 8 and the connection electrodes 12 as well as the bonding between the metal bonding portions 9 and 13 along the peripheries of the SAW resonators are strong, sufficient strength to the polishing process can be obtained. As a result, the height of the resultant SAW resonator can be reduced, so that it is possible to implement a desired thin product. This is advantageous in a case where it is difficult to form the glass wafer 22 having a thickness corresponding to a desired thickness of the cover 3 in terms of workability of the glass plate piece. The polishing process may be omitted in a case where a glass wafer having a desired thickness can be prepared.

After the wafer stacked structure is rinsed, metal films 14 are formed on inner circumferential surfaces of the through-holes 11 and the connection electrodes 12 by forming a Cr film and an Au film (or a Cr film, an Ni film, and an Au film) with, for example, a sputtering process. Since the through-holes 11 are formed in a tapered shape as described above, it is possible to easily perform the sputtering process on the meal films 14 from the upper surface of the wafer stacked structure. In addition, similarly, on the upper surface of the wafer stacked structure, that is, the upper surface of the cover 3, the external electrodes 15 constructed with a Cr/Au film (or a Cr/Ni/Au film) are formed in desired patterns (see FIG. 4D).

The metal films 14 and the external electrodes 15 may be simultaneously formed by using the sputtering process.

Next, the through-holes 11 are filled with the conductive material to form the sealing members 16. Since the wettability of the inner circumferential surfaces of the through-holes 11 to the conductive material is improved due to the metal films 14 formed in advance, it is possible to easily perform the filling of the sealing members 16. As a result, it is possible to surely improve the reliability of the electrical conduction through the connection electrodes and extraction electrodes between the alternate finger electrodes of the IDT 5 and the corresponding external electrodes 15 and the hermetic sealing of the through-holes. Finally, an individualizing process is performed by dicing the wafer stacked structure along the outlines 24 of the SAW resonators which are perpendicular to each other in transverse and longitudinal directions. As a result, the quartz oscillator 1 shown in FIGS. 1A and 1B is provided.

In an alternative embodiment, the glass wafer 22 is formed to allow the cover 3 to have other frequency adjusting through-holes (not shown). The frequency can be adjusted by externally performing dry etching on SAW chip quartz planes of the individualized SAW resonators through the frequency adjusting through-holes. The frequency-adjusted SAW resonators are disposed in a vacuum, and the frequency adjusting through-holes are hermetically closed by fusing, for example, a low melting point metal material. In this case, in order to improve wettability, it is preferable that metal films made of a conductive material are formed on inner surfaces of the frequency adjusting through-holes in advance.

Figure 5:
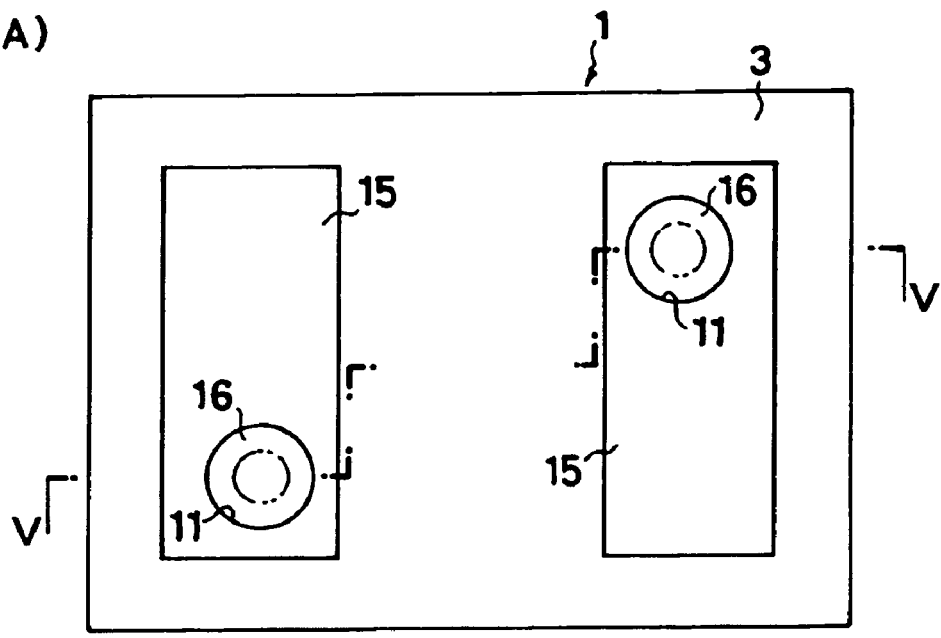
FIG. 5A is a plan view showing a SAW resonator according to a second embodiment of the invention.
FIG. 5B is a cross sectional view taken along line V-V of FIG. 5A.
Figure 5:
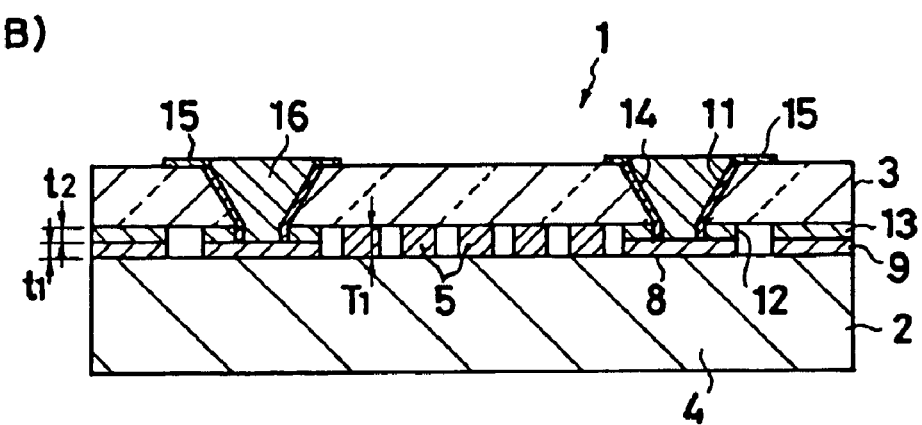

FIGS. 5A and 5B show a SAW resonator according to a second embodiment of the invention. Similarly to the first embodiment in FIGS. 1A and 1B, the SAW resonator 1 according to the embodiment has a structure where a SAW chip 2 and a cover 3 are directly bonded. As shown in FIGS. 5B and 6, the SAW chip 2 includes an IDT 5 constructed with a pair of alternate finger electrodes formed on a central region of an upper surface of a piezoelectric substrate 4 made of quartz or the like, reflectors 6 and 6 disposed at both longitudinal sides of the IDT, lead wires 7 and 7 extracted from bus bars of the alternate finger electrodes, extraction electrodes 8 and 8 formed at vicinities of diagonal corner portions of the piezoelectric substrate, and a metal bonding portion 9 formed along the entire peripheral portion of the piezoelectric substrate 4.

In the cover 3 constructed with a rectangular glass substrate 10, through-holes 11 and 11 having a tapered shape converging from an upper surface to a lower surface thereof are disposed in the diagonal direction to correspond to the extraction electrodes 8 and 8 of the SAW chip 2. As shown in FIG. 7, on the lower surface of the cover 3, connection electrodes 12 and 12 corresponding to the extraction electrodes 8 and 8 are formed on the opening peripheries of the though-holes, and a metal bonding portion 13 is formed along the entire peripheral portion thereof. In addition, the through-holes 11 and 11 and inner circumferential surfaces of the connection electrodes 12 and 12 are coated with metal films 14 and 14 made of a conductive material. On the upper surface of the cover 3, external electrodes 15 and 15 are formed in the opening peripheries of the through-holes and electrically connected to the connection electrodes 12 and 12 through the metal films 14 and 14 of the through-holes adjacent to the external electrodes.

Similarly to the first embodiment, the SAW chip 2 and the cover 3 are bonded in a body by, for example, thermally pressing the metal bonding portion 9 and the metal bonding portion 13 and thermally pressing the extraction electrodes 8 and 8 and the connection electrodes 12 and 12. In an alternative embodiment, the SAW chip 2 and the cover 3 can be bonded by forming an AuSn alloy film on a Cr/Au film of the connection electrodes 12 and 12 and the metal bonding portion 13 and performing a thermal pressing process or a eutectic bonding process. The through-holes 11 and 11 are filled with sealing members 16 made of a conductive material such as AuSn, AuGe, a solder material, and a high temperature solder, so that it is possible to surely improve the reliability of the electrical conduction between the extraction and connection electrodes and the external electrodes and the hermetic sealing of the through-holes.

In the embodiment, the IDT 5, the reflectors 6 and 6, and the lead wires 7 and 7 are hermetically sealed within a space defined between the SAW chip 2 and the cover 3 by directly contacting the upper end of the SAW chip 2 and the lower surface of the cover 3. As a result, thicknesses t1 of the metal bonding portion 9 and the extraction electrodes 8 and thicknesses t2 of the metal bonding portion 13 and the connection electrodes 12 are determined so that a thickness t1+t2 in the bonded state thereof is equal to a thickness T1 of the Al film which the IDT 5, the reflectors 6 and 6, or the like are constructed with.

As a result, the gaps between the IDT 5 or the like of the SAW chip and the lower surface of the cover 3 are removed, so that the thickness of the SAW resonator 1 can be reduced down to a minimum thickness. In addition, since the spaces between the alternate finger electrodes constituting the IDT are closed by the lower surface of the cover 3, extrinsic material such as metal debris cannot penetrate into the spaces, so that it is possible to prevent short-circuiting between the alternate finger electrodes. In addition, it is clarified by the inventors that, although the IDT 5 and the cover 3 are contacted to each other, there is no substantial change in a resonance frequency or a CI value, and the characteristics of at least a practical SAW resonator 1 are not influenced.

Figure 8:
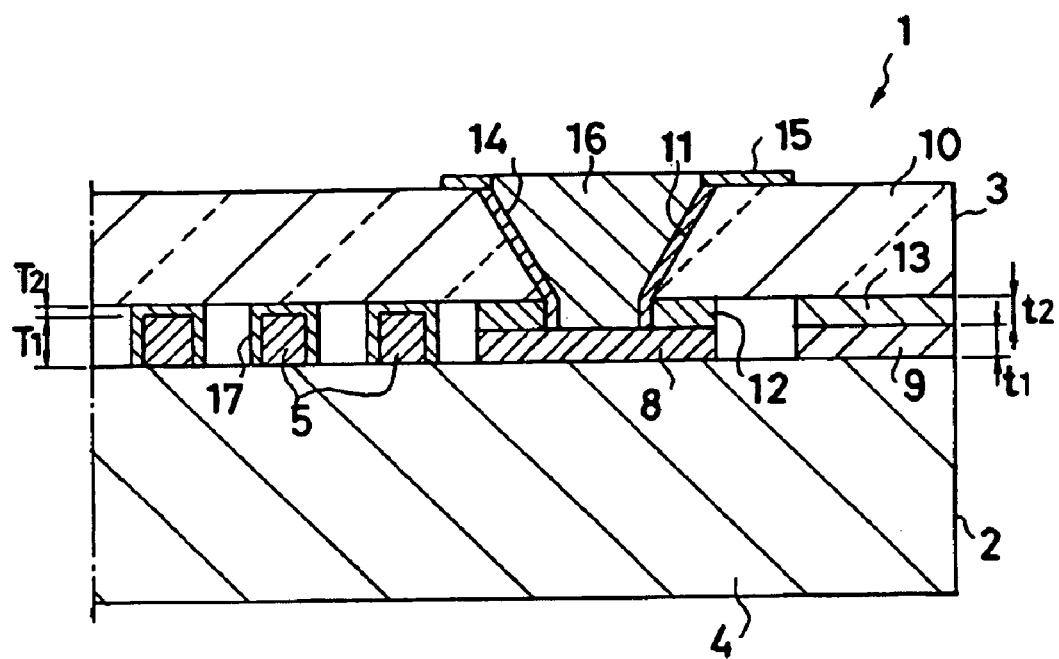
FIG. 8 is a partially enlarged cross sectional view showing a SAW resonator according to a modified example of the second embodiment.

FIG. 8 shows a modified example of the SAW resonator according to the second embodiment. In the SAW resonator 1 according to the modified example, each of the alternative finger electrodes of the IDT 5 formed on the upper surface of the SAW chips 2 are constructed with an Al film and a protective film 17 made of alumina coated on the Al film. In this case, the thickness of the IDT 5, that is, a total thickness T1+T2 of a thickness T1 of the Al film and a thickness T2 of the protective film 17 are determined so as to be equal to the thickness t1+t2 of the bonded state of the metal bonding portion 9 and extraction electrodes 8 and of the metal bonding portion 13 and the connection electrodes 12. The protective film 17 may be formed by, for example, performing a positive electrode oxidation process on a surface of the Al film formed on the SAW chip 2.

By doing so, similarly to the embodiment shown in FIGS. 5A and 5B, the IDT 5, the reflectors 6 and 6, and the lead wires 7 and 7 are hermetically sealed within a space defined between the SAW chip 2 and the cover 3 in a state of directly contacting the upper end of the ITD 5 and the lower surface of the cover 3. As such, since the alternate finger electrodes of the IDT 5 are coated with the protective film 17, although the cover 3 exerts some pressure on the IDT 5, the influence of the pressure on the operation of the SAW resonator 1 can be more surely eliminated or alleviated.

Now, processes for manufacturing the SAW resonator of FIGS. 5A and 5B will be described with reference to FIGS. 9A to 9D, similarly to the embodiment shown in FIGS. 4A to 4D. First, a large-sized SAW chip quartz wafer 21 in which a plurality of the SAW chips 2 of FIG. 6 are continuously disposed in transverse and longitudinal directions is prepared.

In the quartz wafer 21, a Cr/Au film having a predetermined thickness t1' is formed on a surface of a quartz wafer plate piece, and the extraction electrodes 8 and the metal bonding portions 9 of each SAW chip are formed in desired patterns by using a photolithography technique. Next, an Al film having a predetermined thickness T1 is formed on the surface of the quartz wafer plate piece, and the IDT 5, the reflectors 6, and the lead wires 7 of each SAW chip are formed in desired patterns and so as to electrically connect the lead wires to the extraction electrodes 8 by using a photolithography technique, similarly. Since the Al film is formed later on, although an oxide film is formed on a surface thereof due to air contact, the electrical conduction to the extraction electrodes 8 constructed with the Cr/Au film in advance does not deteriorate.

In an alternative embodiment, the IDT, the reflectors and the lead wires may be formed in desired pattern films and thicknesses by depositing aluminum. In addition, in a case where the SAW resonator according to the modified example shown in FIG. 8, the quartz wafer 21 is manufactured so that the IDT 5 of each of the SAW chips is coated with the protective film 17. The protective film 17 may be formed by, for example, performing a positive electrode oxidation process on the Al film formed on the quartz wafer plate piece. In this case, the thickness T2 of the protective film 17 can be controlled to be a desired thickness by adjusting conditions of the positive oxidation process.

In addition, a large-sized cover glass wafer 22 in which a plurality of the covers 3 of FIG. 7 are continuously disposed in transverse and longitudinal directions is prepared. In the glass wafer 22, the though-holes 11 of each cover are formed on each glass plate piece by performing, for example, a sand blasting process or an etching process. In particular, by using the sand blasting process, it is possible to easily form the through-holes in a desired tapered shape. Next, a Cr/Au film having a predetermined thickness t2' is formed on a lower surface of the glass plate piece, that is, a bonding surface for the SAW chip, and the connection electrodes 12 and the metal bonding portions 13 of each cover are formed in desired patterns by using a photolithography technique.

Figure 9:
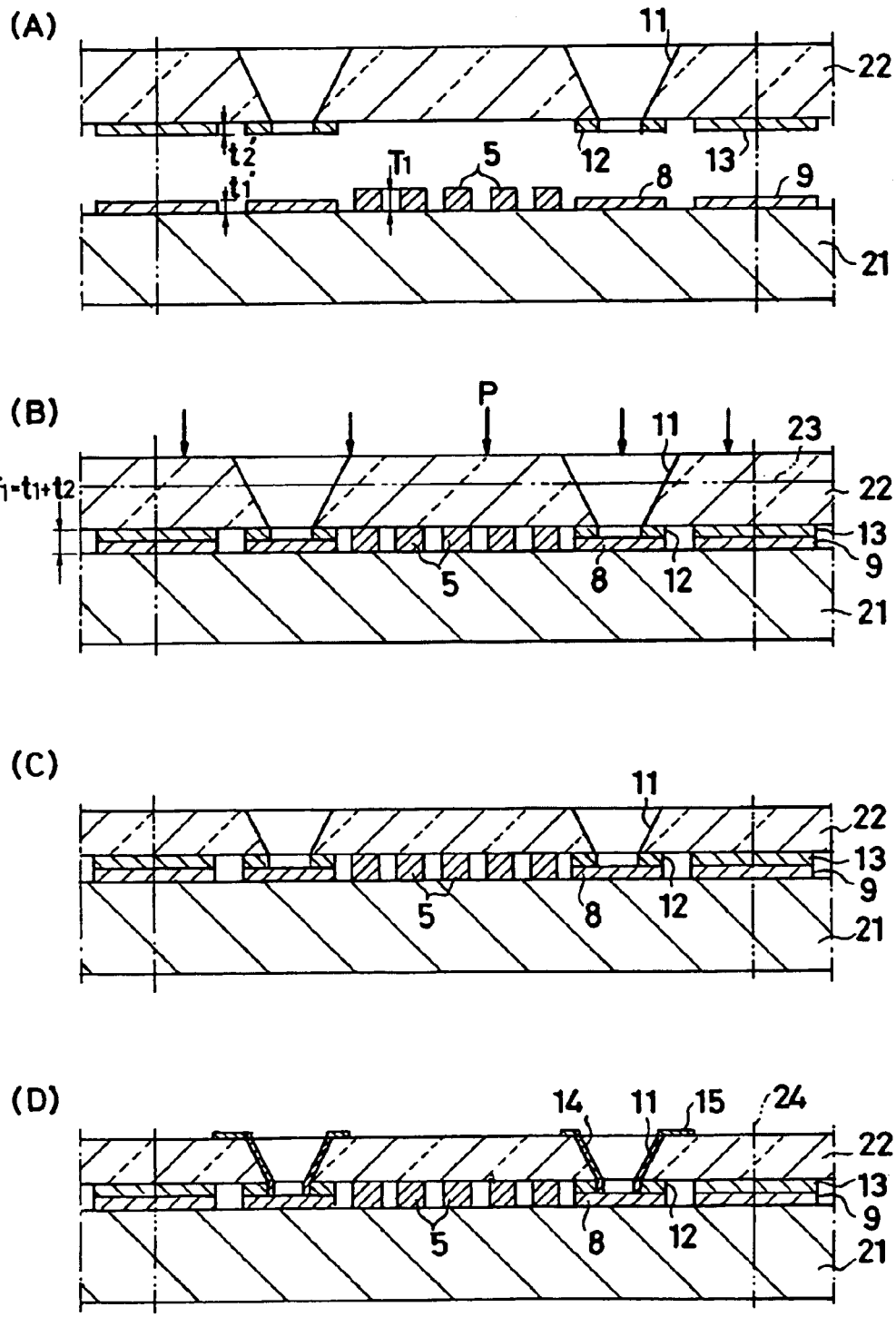
FIGS. 9A to 9D are partially enlarged cross sectional views of a quartz wafer and a glass wafer for explaining a sequence of processes of a method of manufacturing the SAW of FIG. 5.

As shown in FIG. 9A, the quartz wafer 21 and the glass wafer 22 are aligned in up/down directions. As shown in FIG. 9B, the metal bonding portions 9 and the metal bonding portions 13 are contacted to overlap with each other, and the extraction electrodes 8 and the connection electrodes 12 are contacted to overlap with each other. By taking into consideration a decrease in the thicknesses of the metal films during the bonding, it is preferable that the thicknesses t1' of the extraction electrodes 8 and the metal bonding portions 9 of the quartz wafer 21 and the thicknesses t2' of the connection electrodes 12 and the metal bonding portions 13 of the quartz wafer 22 are determined so that a total thickness t1'+t2' thereof is slightly larger than a thickness t1+t2=T1 in the bonded state.

In the state that the wafers 21 and 22 are overlapped with each other, the wafers 21 and 22 are pressed and heated with a thermal pressing process using a commercially available bonding apparatus to be bonded in a body. The pressing is performed to exert the pressure from the upper surface of the glass wafer 22 uniformly on the entire surface thereof, so that the upper ends of the IDT 5, the reflectors 6 and 6 and the lead wires 7 and 7 contact the lower surface of the cover 3. As a result, the IDT 5, the reflectors 6 and 6, and the like are hermetically sealed within a space defined between the SAW chip 2 and the cover 3. In an alternative embodiment, in a process for forming the glass wafer 22, an AuSn alloy film is formed on the Cr/Au film of the connection electrodes 12 and the metal bonding portions 13, and similarly, in the aligned and overlapped state thereof, the wafers may be bonded in a body by performing a thermal pressing process or a eutectic bonding process.

According to the embodiment, the gaps between the IDT 5 or the like of the SAW chip and the lower surface of the cover 3 are removed, so that the thickness of the SAW resonator 1 can be reduced down to a minimum thickness. In addition, since the spaces between the alternate finger electrodes constituting the IDT are closed by the lower surface of the cover 3, extrinsic material such as metal debris generated during the following processes cannot penetrate into the spaces, so that it is possible to prevent short-circuiting between the alternate finger electrodes.

Next, an upper surface of the wafer stacked structure which is formed in the above bonding process, that is, a surface of the cover 3 is uniformly polished down to a height denoted by virtual line 23 of FIG. 9B (see FIG. 9C), and the height of the resultant SAW resonator can be reduced, so that it is possible to implement a desired thin product. The polishing process may be omitted in a case where a glass wafer having a desired thickness can be prepared.

After the polished wafer stacked structure is rinsed, metal films 14 are formed on inner circumferential surfaces of the through-holes 11 and the connection electrodes 12 by forming a Cr film and an Au film (or a Cr film, an Ni film, and an Au film) with, for example, a sputtering process. In addition, similarly, on the upper surface of the wafer stacked structure, that is, the upper surface of the cover 3, the external electrodes 15 constructed with a Cr/Au film (or a Cr/Ni/Au film) are formed in desired patterns (see FIG. 9D).

Next, the through-holes 11 are filled with the conductive material to form the sealing members 16. As a result, it is possible to surely improve the reliability of the electrical conduction through the connection electrodes and extraction electrodes between the alternate finger electrodes of the IDT 5 and the corresponding external electrodes 15 and the hermetic sealing of the through-holes. Finally, an initializing process is performed by dicing the wafer stacked structure along outlines 24 of the SAW resonators which are perpendicular to each other in transverse and longitudinal directions. As a result, the quartz oscillator 1 shown in FIGS. 5A and 5B is provided.

In an alternative embodiment, a glass wafer 22 is formed to allow a cover 3 to have other frequency adjusting through-holes (not shown), and the frequency can be adjusted by externally performing dry etching on SAW chip quartz planes of the individualized SAW resonators through the frequency adjusting through-holes. After adjusting the frequency, the frequency adjusting through-holes are hermetically closed by fusing, for example, a low melting point metal material in a vacuum.

Figure 10:
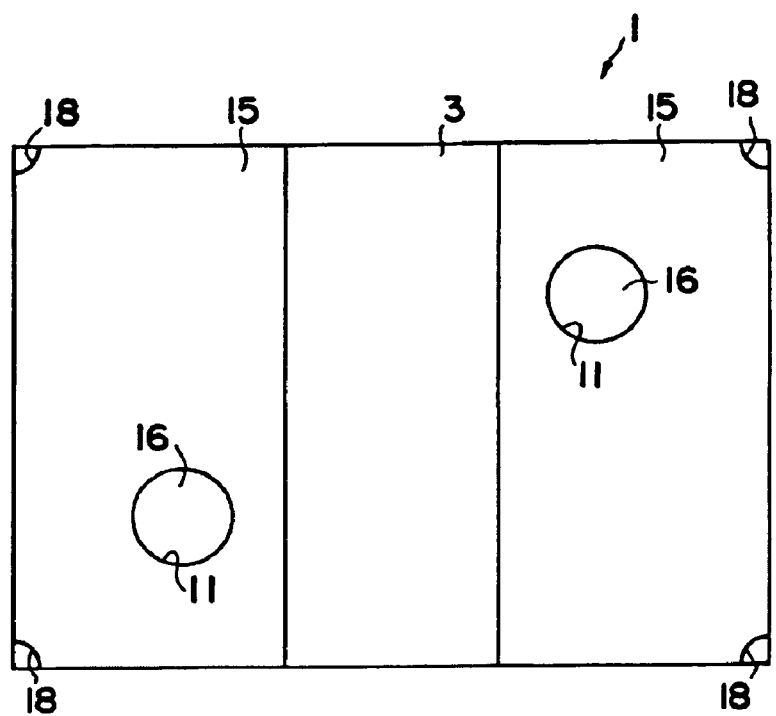
FIG. 10A is a plan view showing a SAW resonator according to a modified example of the first embodiment.
FIG. 10B is a side view thereof.
Figure 10:
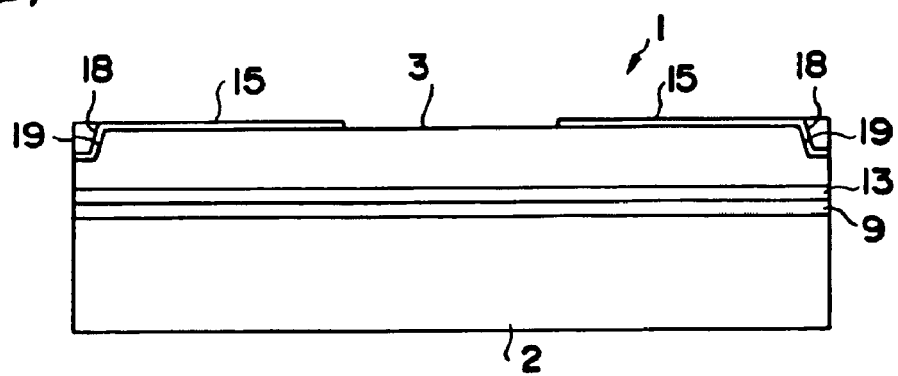

FIGS. 10A and 10B show a modified example of the SAW resonator 1 of FIGS. 1A and 1B. Concave portions 18 having a substantially quadrant circle shape are formed at the corner portions on an upper surface of the covers 3 where the though-holes 11 and external electrodes 15 at opening peripheries thereof are formed. In the embodiment, the external electrodes 15 are formed on the entire upper surface excluding a longitudinal central region of the glass substrate 10, and the concave portions 18 are formed to overlap with the external electrodes 15. As a result, since conductive adhesive such as a solder paste used to mount the SAW resonator 1 on a surface of a print board or the like can deeply penetrate into the concave portions 18, the adhesion area can increase, and the SAW resonator 1 can be supported by the side surfaces thereof. Accordingly, a good adhesive state can be obtained, and a mechanical strength against bending after mounting can be improved. In addition, by providing the concave portions 18 to the corner portions of the cover 3, careless breakage of the corner portions of the cover 3 made of a fragile material such as glass in the embodiment can be prevented, so that it is possible to improve handling workability.

In the embodiment, metal films 19 are coated on the inner surface of the concave portions 18 so as to form side surface electrodes connected to the external electrodes 15. As a result, it is possible to improve the wettability to conductive adhesive used to mount the SAW resonator 1 on a print board (not shown) or the like, so that adhesiveness can be improved. In addition, the areas of the external electrodes 15 are substantially enlarged, so that the electrical connection performance can be improved. In addition, the side surface electrodes are not formed on the entire thickness of the glass substrate 10, but the side electrodes are limitedly formed within the concave portions 18, so that it is possible to suitably prevent electrical short-circuiting between the SAW chip 2 and cover 3 and the bonding films 9 and 13. In addition, although the problem of electrical short-circuiting can be prevented by using a resin material for the bonding films, other problems in reliability such as insufficient water resistance may occur.

Figure 11:
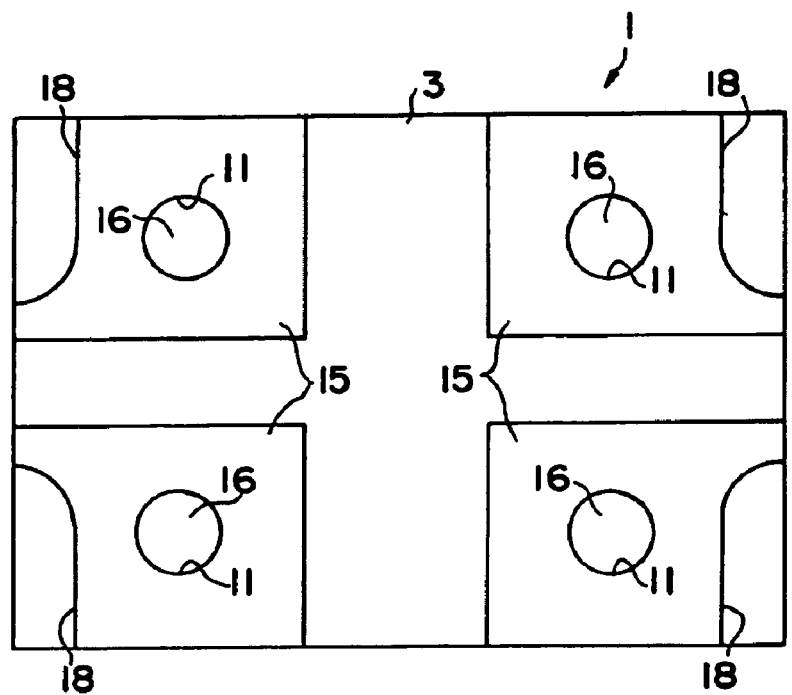
FIG. 11 is a plan view of a SAW resonator having a foot pattern different from that of FIGS. 10A and 10B.

The shape and array, that is, a foot print of the external electrodes 15 may be formed in various ones according to the number of the extraction electrodes or the like, as needed. FIG. 11 shows an example where the number of the external electrodes 15 is four instead of two as in FIGS. 10A and 10B, and in other words, each of the external electrodes 15 of FIGS. 10A and 10B is divided into two in a width direction. In addition, in the embodiment, the concave portions 18 are formed in a shape of a large groove which is elongated from each of the corner portions of the cover 3 along each of the longitudinal edges. Similarly, since the adhesion area can increase due to the concave portions 18, a good adhesive state can be obtained, and a mechanical strength against bending after the mounting can be improved. In addition, breakage of the corner portions of the covers 3 is prevented, and in a case where the inner portions thereof are coated with the metal films, the wettability to the conductive adhesive and electrical connection performance can be improved.

Figure 12:
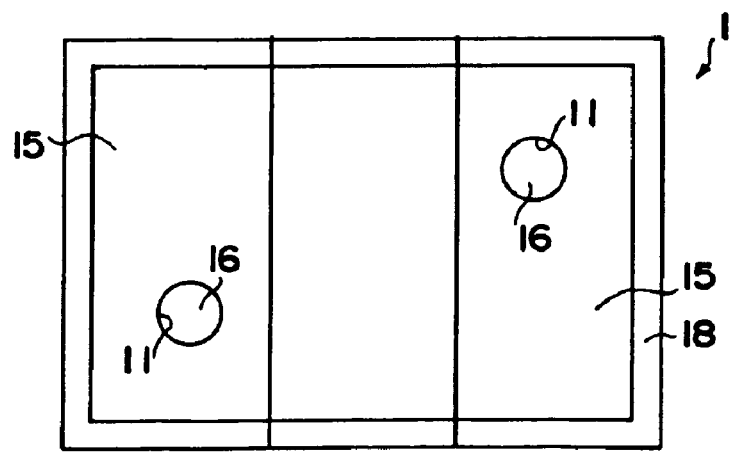
FIG. 12 is a plan view of a SAW resonator in which concave portions having a pattern different from that of FIGS. 10A and 10B are disposed.

FIGS. 12 to 14 shows concave portions 18 having various shapes and array patterns in a SAW resonator 1 similar to that shown in FIGS. 10A and 10B. Referring to FIG. 12, the concave portions 18 may be formed in a shape of step differences having a predetermined width along an entire circumferential edge of an upper surface of the cover 3. Referring to FIG. 13, the concave portions 18 may be formed with a plurality of straight line shaped grooves which extend parallel to each other in a slanted direction on an upper surface of the cover 3. In the embodiment shown in the figure, the grooves for the concave portions 18 are disposed to traverse the through-holes 11. Referring to FIG. 14, the concave portions 18 may be formed with a plurality of recesses which are disposed relatively in random. However, the concave portions 18 are not limited to the aforementioned shapes, but the concave portions 18 may be formed in various shapes such as a circle and ellipse. In addition, the cross section thereof may be determined from various shapes such as V, ⊃, and U shapes.

The SAW resonator 1 according to the modified embodiment may be manufacture by using the manufacturing processes described with reference to FIGS. 4A to 4D and 9A to 9D. FIGS. 15A and 15B shows the glass wafer 22 used to manufacture the SAW resonator 1 of FIGS. 10A and 10B. As shown in FIG. 15A, in the process for forming the through-holes 11 on an upper surface of the glass wafer 22, concave portions 20 having the shape of a circle are formed to correspond to the concave portions 18 having the shape of a quadrant circle by using a blast process or an etching process. After the glass wafer 22 and the quartz wafer 21 on which the IDTs 5 or the like are formed are bonded in a body, external electrodes 15 are formed on an upper surface of the glass wafer 22, as shown in FIG. 15B. At the same time, metal films are formed on inner circumferential surfaces of the through-holes 11 and inner surfaces of the concave portions 20.

Figure 16:
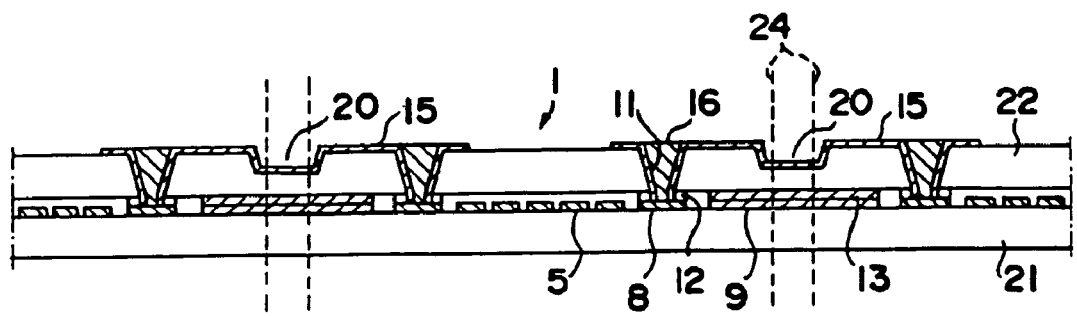
FIG. 16 is a cross sectional for explaining an individualizing process using dicing in a process for manufacturing the SAW resonator of FIGS. 10A and 10B.

Finally, as shown in FIG. 16, an individualizing process is performed by dicing the wafer stacked structure along the outlines 24 of the SAW resonators which are perpendicular to each other in transverse and longitudinal directions. The concave portions 20 desirably have a size larger than a width of the blade used for the dicing.

In an alternative embodiment, the concave portions 20 may be formed by dicing the surface of the glass wafer 22. This method is particularly suitable to manufacture the SAW resonator 1 having straight line shaped concave portions 18, as shown in FIG. 12. FIGS. 17A and 17B shows the glass wafer 22 used to manufacture the SAW resonator 1 of FIG. 12. As shown in FIG. 17A, before or after the process for forming the through-holes 11 on an upper surface of the glass wafer 22, concave portions 20 having wide straight line shaped grooves are formed to correspond to the concave portions 18 having straight line shaped grooves by using a blast process or an etching process. The blade used for the groove forming process for the concave portions 20 has a width larger than that of the blade used for the individualizing process.

After the glass wafer 22 and the quartz wafer 21 on which the IDTs 5 or the like are formed are bonded in a body, external electrodes 15 are formed on an upper surface of the glass wafer 22, as shown in FIG. 17B. At the same time, metal films are formed on inner circumferential surfaces of the through-holes 11 and inner surfaces of the concave portions 20. Finally, an individualizing process is performed by dicing the wafer stacked structure in transverse and longitudinal directions along the outlines 24 of the SAW resonators. Since the dicing for individualization is performed along portions to which the thin groove forming process of the concave portion 20 is performed, resistance to cutting is small, so that the cutting can be performed at a higher speed.

Although the embodiments suitable for the present invention are described in detail, the invention can be employed in various modified examples of the embodiments. For example, the invention may be applied to other SAW devices using a SAW element such as a filter and an oscillator. In addition, although only the glass wafer is polished in order to implement a thin SAW device in the above embodiment, the quartz wafer or both the glass and quartz wafers may be polished in other embodiments. In addition, the SAW device according to the invention may be built into an IC card or a mobile electronic apparatus.

What is claimed is:

1. A surface acoustic wave device comprising:
    a surface acoustic wave (SAW) chip having:
        IDT electrodes disposed on a main surface of a piezoelectric substrate;
        extraction electrodes extracted from the IDT electrodes; and
        a metal bonding portion disposed along an entire periphery of the main surface of the piezoelectric substrate; and
    a cover having:
        through-holes in an insulating substrate at positions corresponding to the extraction electrodes of the SAW chip;
        a metal bonding portion disposed along an entire periphery of a lower surface of the insulating substrate;
        connection electrodes disposed on the lower surface of the insulating substrate along circumferences of openings of the through-holes; and
        external electrodes disposed on an upper surface of the insulating substrate in peripheries of openings of the through-holes;
        concave portions disposed at positions at least partially overlapping with the external electrodes on the upper surface of the cover;
    wherein the SAW chip and the cover are bonded in a body by bonding the metal bonding portion of the SAW chip and the metal bonding portion of the cover and bonding the extraction electrodes of the SAW chip and the connection electrodes of the cover so as to hermetically seal the IDT electrodes within a space defined between the SAW chip and the cover, and
    wherein the IDT electrodes and the external electrodes are electrically connected to each other through a conductive material in the through-holes that is independent from the connection electrodes and the external electrodes.

2. The surface acoustic wave device according to claim 1, wherein the space between the SAW chip and the cover in a bonded state is larger than a thickness of the IDT electrode.

3. The surface acoustic wave device according to claim 1, wherein the space between the SAW chip and the cover in a bonded state is equal to a thickness of the IDT electrode.

4. The surface acoustic wave device according to claim 1, wherein the concave portions are disposed at outer peripheral edges of the cover.

5. The surface acoustic wave device according to claim 1, wherein the concave portions are coated with metal films.

6. The surface acoustic wave device according to claim 1, wherein inner circumferential surfaces of the through-holes are coated with metal films made of the conductive material to electrically connect the IDT electrodes and the external electrodes.

7. The surface acoustic wave device according to claim 1, wherein the metal bonding portion and the extraction electrodes of the SAW chip comprise a Cr/Au film, and the metal bonding portion and the connection electrodes of the cover comprise a Cr/Au film.

8. The surface acoustic wave device according to claim 7, wherein the metal bonding portion and the connection electrodes of the cover has an AuSn alloy film disposed on the Cr/Au film.

9. An IC card having the surface acoustic wave device according to claim 1 built therein.

10. A mobile electronic apparatus having the surface acoustic wave device according to claim 1 built therein.

11. A method of manufacturing a surface acoustic wave device comprising steps of:
    forming a SAW chip having:
        IDT electrodes disposed on a main surface of a piezoelectric substrate;
        extraction electrodes extracted from the IDT electrodes; and
        a metal bonding portion disposed along the entire periphery of the main surface of the piezoelectric substrate;
    forming a cover having:
        through-holes in an insulating substrate at positions corresponding to the extraction electrodes of the SAW chip;

a metal bonding portion disposed along an entire periphery of a lower surface of the insulating substrate; and connection electrodes disposed on the lower surface of the insulating substrate along circumferences of openings of the through-holes;

bonding the SAW chip and the cover in a body by bonding the metal bonding portion of the SAW chip and the metal bonding portion of the cover and bonding the extraction electrodes of the SAW chip and the connection electrodes of the cover so as to hermetically seal the IDT electrodes within a space defined between the SAW chip and the cover;

forming external electrodes in peripheries of openings of the through-holes on an upper surface of the cover;

forming concave portions at positions at least partially overlapping with the external electrodes on the upper surface of the cover; and forming a conductive material in the through-holes that is independent of the external electrodes and the connection electrodes and electrically connecting the IDT electrodes and the external electrodes.

12. The method according to claim 11, wherein the IDT electrodes and the external electrodes are electrically connected to each other by forming metal films made of the conductive material on inner circumferential surfaces of the through-holes.

13. The method according to claim 11, further comprising, after the SAW chip and the cover are bonded in a body, a step of polishing a surface of at least one of the SAW chip and the cover.

14. The method according to claim 11, wherein the metal bonding portion and the extraction electrodes of the SAW chip are formed with a Cr/Au film, the metal bonding portion and the connection electrodes of the cover are formed with a Cr/Au film, and the metal bonding portion and the extraction electrodes of the SAW chip and the metal bonding portion and the connection electrodes of the cover are bonded with a thermal pressing process.

15. The method according to claim 11, wherein the metal bonding portion and the extraction electrodes of the SAW chip are formed with a Cr/Au film, the metal bonding portion and the connection electrodes of the cover are formed with a Cr/Au film and an AuSn alloy film thereon, and the metal bonding portion and the extraction electrodes of the SAW chip and the metal bonding portion and the connection electrodes of the cover are bonded with one of a thermal pressing process and a eutectic bonding process.

16. The method according to claim 11, further comprising steps of:

forming a SAW chip wafer on which a plurality of the SAW chips are sequentially disposed in the step of forming the SAW chip;

forming a cover wafer on which a plurality of the covers are sequentially disposed in the step of forming the cover;

bonding the SAW chip wafer and the cover wafer in a body to form a wafer stacked structure by bonding the metal bonding portions of the SAW chips of the SAW chip wafer and the metal bonding portions of the covers of the cover wafer and bonding the extraction electrodes of the SAW chips and the connection electrodes of the covers in the step of bonding the SAW chip and the cover in a body; and dicing the wafer stacked structure into individual SAW devices.

\* \* \* \* \*